(12) United States Patent
Pierrat (10) Patent No.: US 8,103,984 B1
(45) Date of Patent: Jan. 24, 2012

(54) SYSTEM AND METHOD FOR COMPRESSED DESIGN PHASE CONTOUR DATA

(75) Inventor: Christophe Pierrat, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 335 days.

(21) Appl. No.: 12/391,193

(22) Filed: Feb. 23, 2009

(51) Int. Cl.
G06F 17/50 (2006.01)
G06F 19/00 (2011.01)
G21K 5/00 (2006.01)
G03F 1/00 (2006.01)

(52) U.S. Cl. ............. 716/53; 716/54; 716/55; 716/111; 700/97; 700/109; 700/120; 700/121; 378/34; 430/4

(58) Field of Classification Search ................... 716/53, 716/54, 55, 111; 700/97, 109, 120, 121; 378/34; 430/4
See application file for complete search history.

(56) References Cited

U.S. PATENT DOCUMENTS

| | | | | |
|---|---|---|---|---|
| 6,077,310 A * | 6/2000 | Yamamoto et al. | ........... | 716/53 |
| 6,444,373 B1 * | 9/2002 | Subramanian et al. | ........... | 430/5 |
| 6,579,651 B2 * | 6/2003 | Subramanian et al. | ........... | 430/5 |
| 6,584,609 B1 * | 6/2003 | Pierrat et al. | ................. | 716/52 |
| 6,753,115 B2 * | 6/2004 | Zhang et al. | ................. | 430/5 |
| 6,763,514 B2 * | 7/2004 | Zhang | ........................ | 716/53 |
| 6,988,259 B2 * | 1/2006 | Pierrat et al. | ................. | 716/52 |
| 7,001,693 B2 * | 2/2006 | Liebmann et al. | ........... | 430/5 |
| 7,003,756 B2 * | 2/2006 | Zhang | ........................ | 716/53 |
| 7,082,596 B2 * | 7/2006 | Liu | ............................ | 716/52 |
| 7,451,068 B2 * | 11/2008 | Melvin, III | .................. | 703/14 |
| 7,458,059 B2 * | 11/2008 | Stirniman et al. | .......... | 716/53 |
| 7,475,383 B2 * | 1/2009 | Suh et al. | .................. | 716/54 |
| 7,487,490 B2 * | 2/2009 | Zhang et al. | ............... | 716/50 |
| 7,568,179 B1 * | 7/2009 | Kroyan et al. | ............. | 716/51 |
| 7,617,477 B2 * | 11/2009 | Ye et al. | .................... | 716/56 |
| 7,694,267 B1 * | 4/2010 | Ye et al. | .................... | 716/53 |
| 7,707,538 B2 * | 4/2010 | Wong et al. | ............... | 716/53 |
| 7,739,650 B2 * | 6/2010 | Torres Robles et al. | ..... | 716/50 |
| 7,882,480 B2 * | 2/2011 | Ye et al. | .................... | 716/53 |
| 2003/0061587 A1 * | 3/2003 | Zhang et al. | ............... | 716/11 |
| 2003/0097647 A1 * | 5/2003 | Pierrat et al. | ............... | 716/19 |
| 2003/0110465 A1 * | 6/2003 | Zhang | ........................ | 716/19 |
| 2003/0118917 A1 * | 6/2003 | Zhang et al. | ............... | 430/5 |
| 2004/0181770 A1 * | 9/2004 | Zhang | ........................ | 716/19 |
| 2005/0223350 A1 * | 10/2005 | Zhang et al. | ............... | 716/21 |
| 2007/0061773 A1 * | 3/2007 | Ye et al. | .................... | 716/21 |
| 2007/0101310 A1 * | 5/2007 | Stirniman et al. | .......... | 716/21 |
| 2007/0162887 A1 * | 7/2007 | Suh et al. | .................. | 716/21 |
| 2008/0195996 A1 * | 8/2008 | Torres Robles et al. | ..... | 716/21 |
| 2008/0301620 A1 * | 12/2008 | Ye et al. | .................... | 716/19 |
| 2008/0309897 A1 * | 12/2008 | Wong et al. | ............... | 355/44 |
| 2009/0178018 A1 * | 7/2009 | Torres Robles et al. | ..... | 716/20 |
| 2009/0210838 A1 * | 8/2009 | Al-Imam | ................... | 716/5 |
| 2009/0241087 A1 * | 9/2009 | Zhang et al. | ............... | 716/21 |
| 2010/0161093 A1 * | 6/2010 | Wong et al. | ............... | 700/97 |
| 2010/0167184 A1 * | 7/2010 | Wong et al. | ............... | 430/5 |

\* cited by examiner

Primary Examiner — Phallaka Kik
(74) Attorney, Agent, or Firm — Kenyon & Kenyon LLP (57) ABSTRACT

According to various embodiments of the invention, systems and methods are provided for compressed design phase contour data created during the manufacturing of integrated circuits. In one embodiment of the invention, the method begins by generating a contour layout from a target layout during the design phase of a circuit. This contour layout is generated by way of a contour generator tool. Next, a set of differences between the contour layout and the target layout are calculated. A dataset containing these differences is generated. In some embodiments, the contour generator uses a post-optical proximity correction (OPC) layout of the target layout in order to generate the contour layout.

22 Claims, 8 Drawing Sheets

SYSTEM AND METHOD FOR COMPRESSED DESIGN PHASE CONTOUR DATA

TECHNICAL FIELD

The present invention relates to integrated circuit manufacturing, and more particularly, some embodiments relate to systems and methods for compressed design space contour data created during the manufacturing of integrated circuits.

DESCRIPTION OF THE RELATED ART

Integrated circuits, or ICs, are generally created by patterning several layers of devices and their interconnections onto a substrate such as a semiconductor wafer. Generally, the circuit designer designs the integrated circuit using an Electronic Design Automation (EDA) tool that allows circuit components to be positioned and connected interactively. This design, in turn, is generated into a circuit layout by the electronic design automation tool. The circuit layout, also referred to as a layout, describes the physical locations and dimensions of the circuit's components, interconnections, and various layers. A layout file is generated that contains a dataset representing a plurality of polygons that make up the layout features on each layer.

The integrated circuit is fabricated by transferring the layout patterns to a semiconductor substrate in a series of layers. The process by which such layers are patterned on the substrate is known as photolithography. During photolithography, a series of photomasks created from the layout file are used to transfer the layout onto the substrate layer by layer.

Before the layout is finalized and the circuit manufactured, validation and enhancement processes may be performed. A process referred to as a Design Rule Check (DRC) is a part of the physical verification of the design that determines whether the layout design satisfies the recommended foundry process parameters called Design Rules. If the design rule check identifies a circuit feature that violates a design rule, the violation is flagged and brought to the designer's attention. The designer can then modify the design to remedy the violation. Another process performed is referred to as Optical Proximity Correction, or OPC. Optical proximity correction is an enhancement process used to model the layout to predict and correct image errors that might arise as a result of the photolithographic operation. Typically, a contour generator receives the circuit layout data and simulates how the layout will appear on the layers as a result of the photolithographic process. The simulation generates contours representing the circuit layout applied to the wafer. The contours can be compared to the target feature dimensions to verify the layout, and adjustments can be made to compensate for the effects of the lithographic process on the actual layout.

With conventional practices, OPC operations are repeated during the manufacturing process. This is because the conventional flow from design to production provides the foundry with the design data for the layers represented as the polygons that make up the features. Accordingly, validations operations performed during design are often repeated during the manufacturing phase. In addition, although alternative forms of the design are created during the design phase (e.g. post-OPC layout, contour layout), such alternatives are not viable options for transfer to the foundry due the amount of data contained within such alternatives.

BRIEF SUMMARY OF EMBODIMENTS OF THE INVENTION

The present invention is directed toward integrated circuit manufacturing, and more particularly, some embodiments relate to systems and methods for enhanced OPC correction techniques. For example, in one embodiment, the design-phase post-OPC contour data is used in the manufacturing process to perform OPC correction in the manufacturing phase. More particularly, the biases between a target layout and post-OPC contour data are determined in the design phase, and this bias data is provided to the manufacturing process. The manufacturing process can then use apply the bias data to the original target layout data to generate the manufacturing phase contour data. The OPC process can be run in the manufacturing phase to generate post OPC layout that targets the contour data rather than the original layout data.

In one embodiment of the invention, a computer-aided design apparatus configured to generate photolithographic data for patterning a circuit design onto a semiconductor wafer is provided. This computer-aided design apparatus comprises a design tool and a manufacturing tool. The design tool can include a processor, a memory connected to the processor, and a computer readable medium having instructions embedded to cause the processor to perform operations according to the invention. The instructions cause the processor to receive target layout data for the circuit design, perform proximity correction on the target layout data to generate post-OPC layout data, generate contour layout data from post-OPC layout data, and calculate differences between the contour layout data and the target layout data to generate contour bias data.

The manufacturing tool also has a processor, a memory connected to the processor, and a computer readable medium having instructions embedded to cause the processor to perform operations according to the invention. The instructions cause the processor to receive the target layout data for the circuit design and the contour bias data from the design tool, apply the contour bias data to the target layout data to regenerate contour layout data at the manufacturing tool, and perform optical proximity correction on the regenerated contour data to generate second post-OPC layout data.

In some such embodiments, the computer-aided design apparatus calculates the differences by first performing the operation of determining a plurality of evaluation points for the contour layout data, wherein the plurality of evaluation points corresponds to evaluation points used to perform optical proximity correction on the target layout. Then the computer-aided design apparatus calculates a displacement between respective ones of the evaluation points for the contour layout data and the evaluation points used to perform optical proximity correction.

In other embodiments, a method of generating compressed photolithographic data for patterning a circuit design onto a semiconductor wafer is provided. Within such embodiments, the method performs the operations of performing optical proximity correction on the target layout data for the circuit design to generate post-OPC layout data, and calculating differences between the contour layout data and the target layout data to generate contour bias data. The method then stores the contour bias data for use in recreating contour layout data.

In further embodiments, a method of generating compressed photolithographic data performs the operation of transferring the target layout data for the circuit design and the contour bias data to a manufacturing tool. In such an embodiment, the manufacturing tool is configured to apply the contour bias data to the target layout data to regenerate contour layout data and to perform optical proximity correction on the regenerated contour data to generate second post-OPC layout data.

In yet further embodiments, the method of generating compressed photolithographic data first performs the operation of receiving at a post-tape-out manufacturing phase tool the target layout data for the circuit design and the contour bias data for post-tape out optical proximity correction. Then, the method performs the operation of applying the contour bias data to the target layout data to regenerate contour layout data during post-tape out optical proximity correction, followed by the operation of performing a post-tape out optical proximity correction on the regenerated contour data to generate second post-OPC layout data.

In other embodiments, a method of generating post-tape-out photolithographic data for patterning a circuit design onto a semiconductor wafer is provided, wherein the method receives at a post-tape-out manufacturing phase, target layout data and contour bias data for the circuit design, wherein contour bias data comprises data representing differences between a contour layout represented by the contour layout data generating during optical proximity correction and a target layout represented by the target layout data. This is followed by the operation of applying the contour bias data to the target layout data to regenerate contour layout data and to perform optical proximity correction on the regenerated contour data to generate manufacturing layout data.

In further such embodiments, the method performs the operation of generating the contour bias data. This operation of generating the contour bias data first determines a plurality of evaluation points for the contour layout data, wherein the plurality of evaluation points corresponds to evaluation points used to perform optical proximity correction on the target layout. Then, the method calculates a displacement between respective ones of the evaluation points for the contour layout data and the evaluation points used to perform optical proximity correction.

In other embodiments, a computer-aided design apparatus configured to generate photolithographic data for patterning a circuit design onto a semiconductor wafer is provided. This computer-aided design apparatus comprises a processor, a memory connected to the processor, and a computer readable medium having instructions embedded to cause the processor to perform the operations according to the invention. The instructions cause the processor to perform optical proximity correction on the target layout data for the circuit design to generate post-OPC layout data, generate contour layout data from post-OPC layout data, and calculate differences between the contour layout data and the target layout data to generate contour bias data. The computer-aided design apparatus then stores the contour bias data for use in recreating contour layout data. The instructions can be configured to cause to cause the processor to perform the operation of transferring the target layout data for the circuit design and the contour bias data to a manufacturing tool. The manufacturing tool can be configured to apply the contour bias data to the target layout data to regenerate contour layout data and to perform optical proximity correction on the regenerated contour data to generate second post-OPC layout data.

In yet further embodiments, a second a computer readable medium having instructions embedded therein is provided, wherein the instructions are configured to cause a processor to receive at a post-tape-out manufacturing phase tool, the target layout data for the circuit design and the contour bias data for post-tape out optical proximity correction. Then, the processor is instructed to apply the contour bias data to the target layout data to regenerate contour layout data during post-tape out optical proximity correction. This is followed by instructions to perform post-tape out optical proximity correction on the regenerated contour data to generate second post-OPC layout data.

In some embodiments, a computer-aided design apparatus configured to generate photolithographic data for patterning a circuit design onto a semiconductor wafer is provided. The computer-aided design apparatus comprises a processor, a memory connected to the processor, and a computer readable medium having instructions embedded to cause the processor to perform the operations according to the invention. The instructions cause the processor to receive at a post-tape-out manufacturing phase, target layout data and contour bias data for the circuit design, wherein contour bias data comprises data representing differences between a contour layout represented by the contour layout data generating during optical proximity correction and a target layout represented by the target layout data. Then, the processor applies the contour bias data to the target layout data to regenerate contour layout data and to perform post-tape out optical proximity correction on the regenerated contour data to generate manufacturing layout data.

In further such embodiments, the process generates the contour bias data. Within this embodiment, generating the contour bias data first comprises determining a plurality of evaluation points for the contour layout data, wherein the plurality of evaluation points corresponds to evaluation points used to perform optical proximity correction on the target layout. Generating the contour bias data then comprises calculating a displacement between respective ones of the evaluation points for the contour layout data and the evaluation points used to perform optical proximity correction.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following Figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

DETAILED DESCRIPTION OF THE EMBODIMENTS OF THE INVENTION

The present invention is directed toward integrated circuit manufacturing, and more particularly, some embodiments relate to systems and methods for enhanced OPC correction techniques. For example, in one embodiment, the design-phase post-OPC contour data is used in the manufacturing process to perfoiui OPC correction in the manufacturing phase. More particularly, the biases between a target layout and post-OPC contour data are determined in the design phase, and this bias data is provided to the manufacturing process. The manufacturing process can then use apply the bias data to the original target layout data to generate the manufacturing phase contour data. The OPC process can be run in the manufacturing phase to generate post OPC layout that targets the contour data rather than the original layout data.

As noted above, with conventional semiconductor device manufacturing techniques, verification processes such as, for example, optical proximity correction are done both in the design phase and in the post tape-out phase. One of the reasons optical proximity correction is repeated in the post tape-out phase is because optical proximity correction typically generates a large volume of data. Accordingly, conventional wisdom dictates that it is easier and more efficient to redo optical proximity correction during the manufacturing phase rather than to transfer the large volumes of data. Indeed, in many practical applications, creating the optical proximity correction data in the design space can result in a post-OPC data volume that is approximately an order of magnitude larger than the original layout data size. This is typically because the ultimate layout shapes generated to compensate for the lithographic phenomenon are much more complex than the typical pre-OPC shapes. For example, a greater number of polygons is typically required to represent the more complex post-OPC patterns than is required to represent the pre-OPC patterns.

Accordingly, in one embodiment of the invention, a compaction technique is provided to allow the post-OPC layout data to be compacted for transfer to the foundry or other manufacturing environment. For example, in some embodiments, OPC correction biases are generated and saved instead of saving the entire data file. In such embodiments, only the correction biases are sent to the foundry rather than the entire post-OPC data set. Then, at the foundry, the correction biases can be applied to the original data set to arrive at the desired post-OPC data set. In one embodiment, the correction biases reflect the differences between the original target layout and the post-OPC contour target. The correction biases are applied to the original target layout to arrive at the post-OPC contour target at the foundry. The foundry can then apply the OPC process targeting the post-OPC contour rather than targeting the original target layout.

To reduce the amount of data ultimately transferred, the OPC correction biases do not contain the entire post-OPC dataset, but reflect only the differences between the original layout patterns the post-OPC layout patterns. For example, in embodiments where optical proximity correction is performed based on a set of evaluation points, the OPC correction biases can represent placement biases or differences between evaluation points in the contour layout and their respective evaluation points in the target layout. In such an embodiment, the contour layout can be recreated in the manufacturing phase by applying the placement biases to the target layout. Because it is often the case that the data set representing the placement biases is significantly smaller than the complex post-OPC data set, it can be more efficient to recreate the contour layout using the placement biases rather than to transfer large volumes of post-OPC data.

Figure 1:
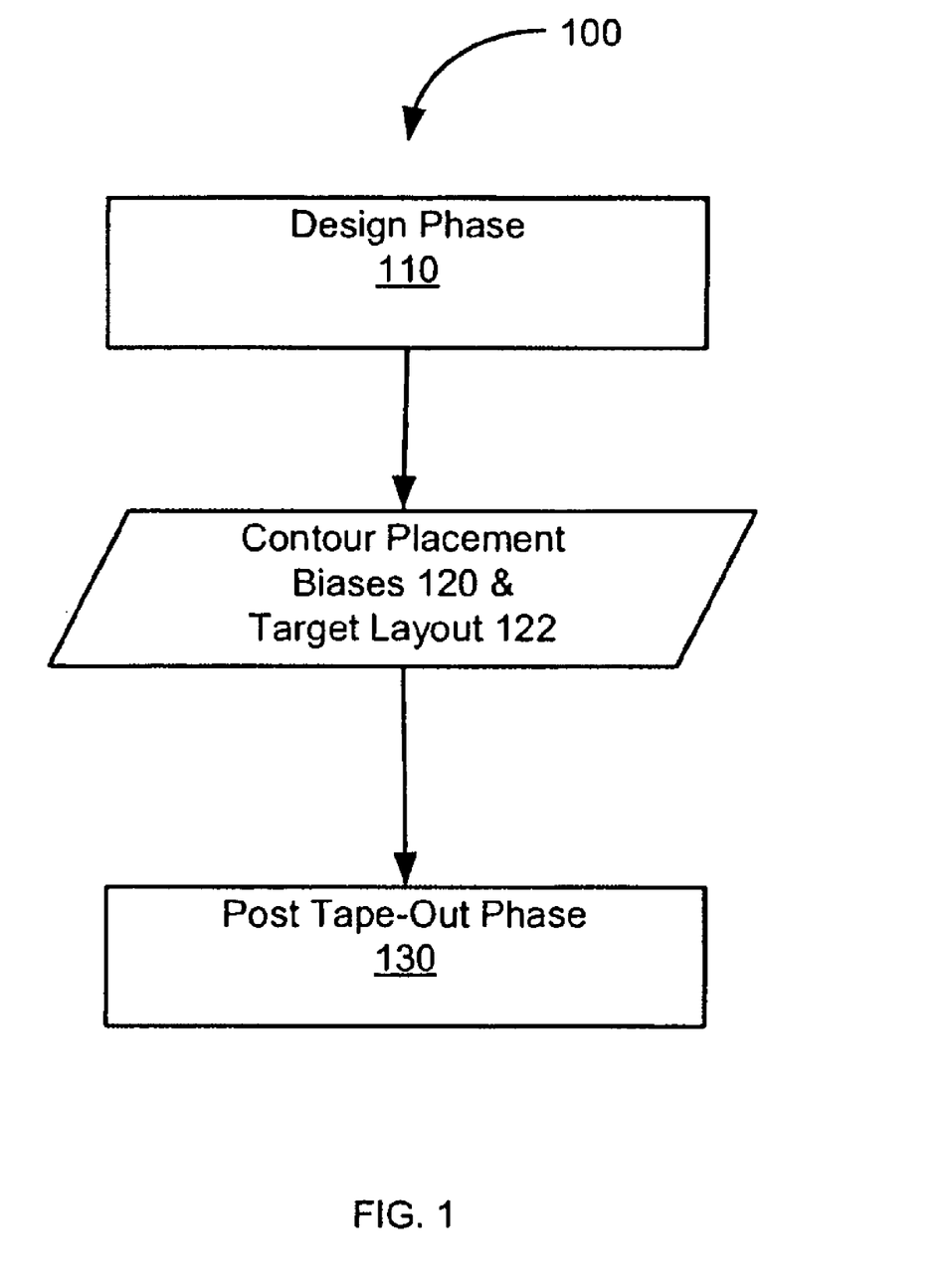
FIG. 1 is a diagram illustrating a high-level example process in accordance with one embodiment of the invention.

FIG. 1 is a process diagram 100 illustrating a high-level example process in accordance with one embodiment of the invention. Referring now to FIG. 1, within the design phase 110, a target layout is created. The target layout 120 is typically a data set comprising a plurality of polygons that together represent the desired layout patterns for the layers of the semiconductor device can be fabricated. Examples of polygons for a portion of a target layout 120 are described in further detail below with reference to FIG. 2.

Within the design phase 110, a contour layout can be generated for lithographic and electrical verification purposes. The contour layout can be generated by performing an optical proximity correction to arrive at a post-OPC layout and simulating the effects of the photolithography operation on the post-OPC layout. Accordingly, the contour layout is a representation of how the final pattern would be manifested on the semiconductor layers.

Rather than send the entire contour layout file to the manufacturing phase, the contour layout is reduced to contour data placement biases 120. The contour placement bias data set 120 is transferred to the post-tape-out phase 130 (also known as the manufacturing phase of a circuit). Each of these phases is explained further in connection with FIG. 5.

Figure 2:
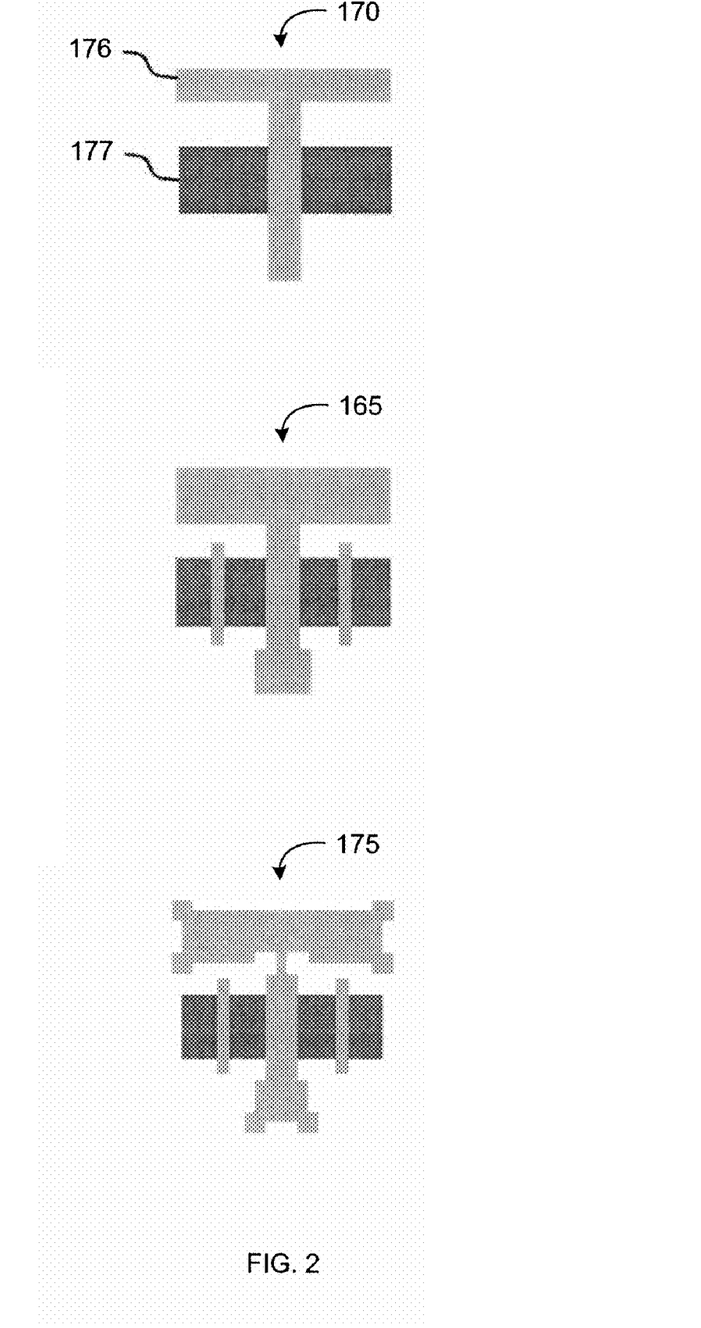
FIG. 2 is a diagram illustrating example portions of a target layout, a target layout after retargeting and resizing, and a post-OPC layout.

FIG. 2 is a diagram illustrating example portions of a target layout, a target layout after retargeting and resizing, and a post-OPC layout. Referring now to FIG. 2, the example original target layout portion 170 is comprised of a plurality of polygons representing a portion of the pattern targeted for transfer to one of the semiconductor layers. As seen from this illustration, this original target layout portion 170 can be described by simple rectangles to represent the "T" shaped pattern 176 overlaying the rectangular pattern 178. The layout portion 165 represents an example of layout portion 170 after retargeting and resizing and after the addition of assist-features that can be added, for example, by a re-targeting and assist feature generator. Assist features can be implemented with off axis illumination conditions to improve depth of focus and uniformity of critical dimensions. Sub-resolution assist features can be used to modify the environment of features such that they appear denser than they would otherwise appear without such assist features.

Layout portion 175 is an example of a portion of the layout (layout portion 170) after OPC processing has been applied. As illustrated by the example at 175, the patterns have been modified to take into account process conditions such that the application of the photolithographic process during manufacturing will more likely result in a better approximation of the original target layout.

Figure 3:
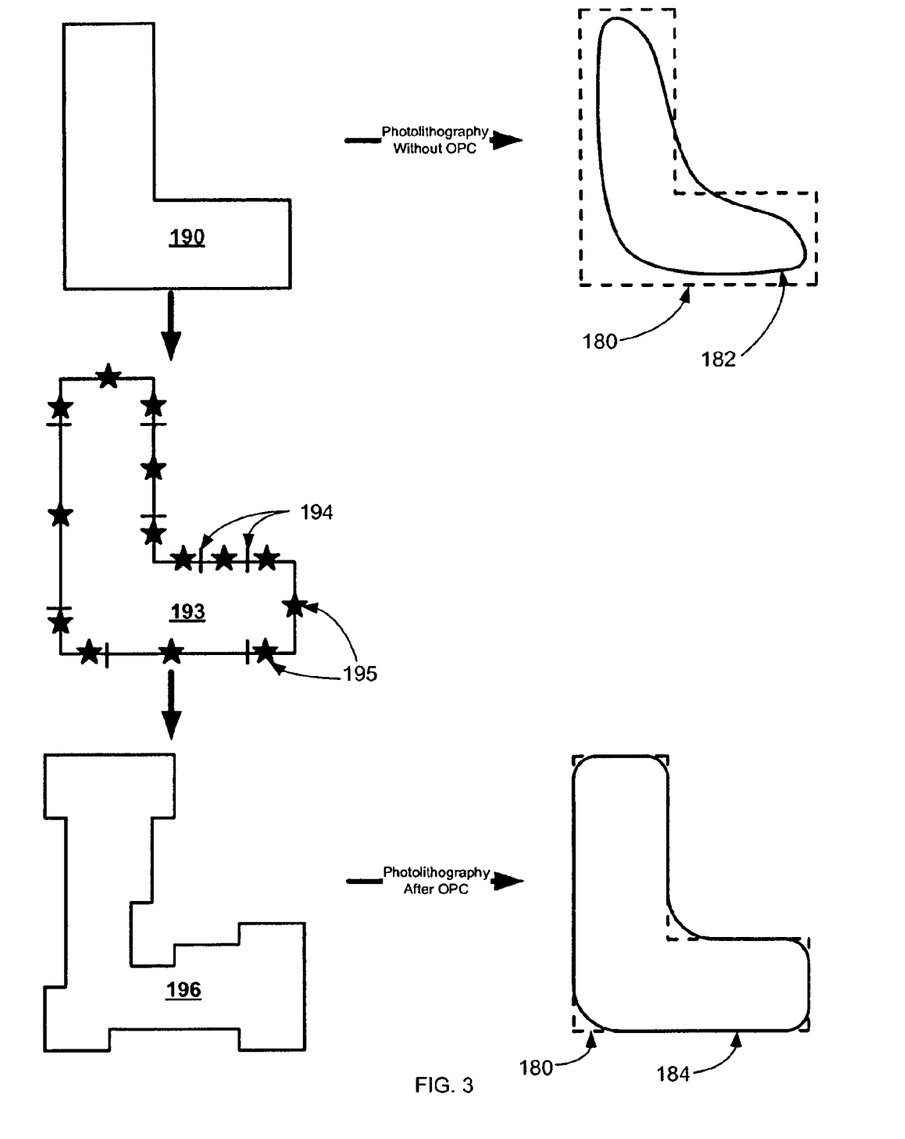
FIG. 3 is a diagram illustrating examples of an application of optical proximity correction to an original target layout resulting in a post-OPC layout and post-OPC contours.

FIG. 3 is a diagram illustrating examples of an application of optical proximity correction to an original target layout to result in a post-OPC layout and post-OPC contours. Referring now to FIG. 3, this example is described with reference to a simple target layout data. This example is the L-shaped portion 190 illustrated in FIG. 3. Due to real-world process conditions, if the photolithographic operations were to be applied to the target layout portion 190 without optical proximity correction the results in this example would be the contour 182. FIG. 3 overlays this contour 182 with the ideal target illustrated by dashed lines 180. As can be seen by this overlay, the resultant contour 182 is different from the target layout portion 190. Accordingly, optical proximity correction is applied to modify the actual layout such that the patterned contour more closely aligns with the original target layout.

With continued reference to FIG. 3, one methodology for optical proximity correction is illustrated with reference to layout portion 193. In this example, dissection points 194 and evaluation points 195 are defined and utilized in performing optical proximity correction.

For example, the edges of layout portion 190 can be divided into segments using disecction points 194 and one or more evaluation points 195 placed on each segment. Using the evaluation point, the OPC process determines how much inward or outward bias should be applied to the segments of the circuit layout to account for photolithographic conditions.

Application of the optical proximity correction process results in layout portion 196 illustrated in FIG. 3. As seen by this example, layout portion 196 is different from the original target layout portion 190 that it represents. These differences are intended to compensate for the photolithographic process to result in patterning of the feature in a manner that more closely resembles the original target layout. An example of this is illustrated in FIG. 3 wherein contour 184 represents a contour generated by the application of the photolithographic process to the post-OPC layout portion 196. As illustrated in this example, post-OPC contour 184 is more closely aligned with original layout portion 190 then was the contour 182 arrived at prior to optical proximity correction.

In one embodiment of the invention, biases or differences between original layout portion 190 and post-OPC contour 184 can be determined. Preferably, these biases are determined to arrive at a data set that is smaller than the data set that would otherwise be used to represent contour 184 accurately. For example, the data set can be defined as differences between original layout 190 and post-OPC contour 184 at the evaluation points. Accordingly, given the original layout data and the generated bias data, post-OPC contours can be generated without rerunning the OPC and simulation process. This contour bias data can be provided to the manufacturing phase such that the manufacturing phase can re-create an approximate post-OPC contour data 184 as previously determined in the design phase without the interim operation of performing OPC on original layout portion 190. After arriving at the contour data, the manufacturing process can perform optical proximity correction on the layout, targeting the correction to the design-phase post-OPC contour 184 rather than to the original target layout 190. Accordingly, a more accurate optical proximity correction can be performed at the manufacturing phase.

Figure 4:
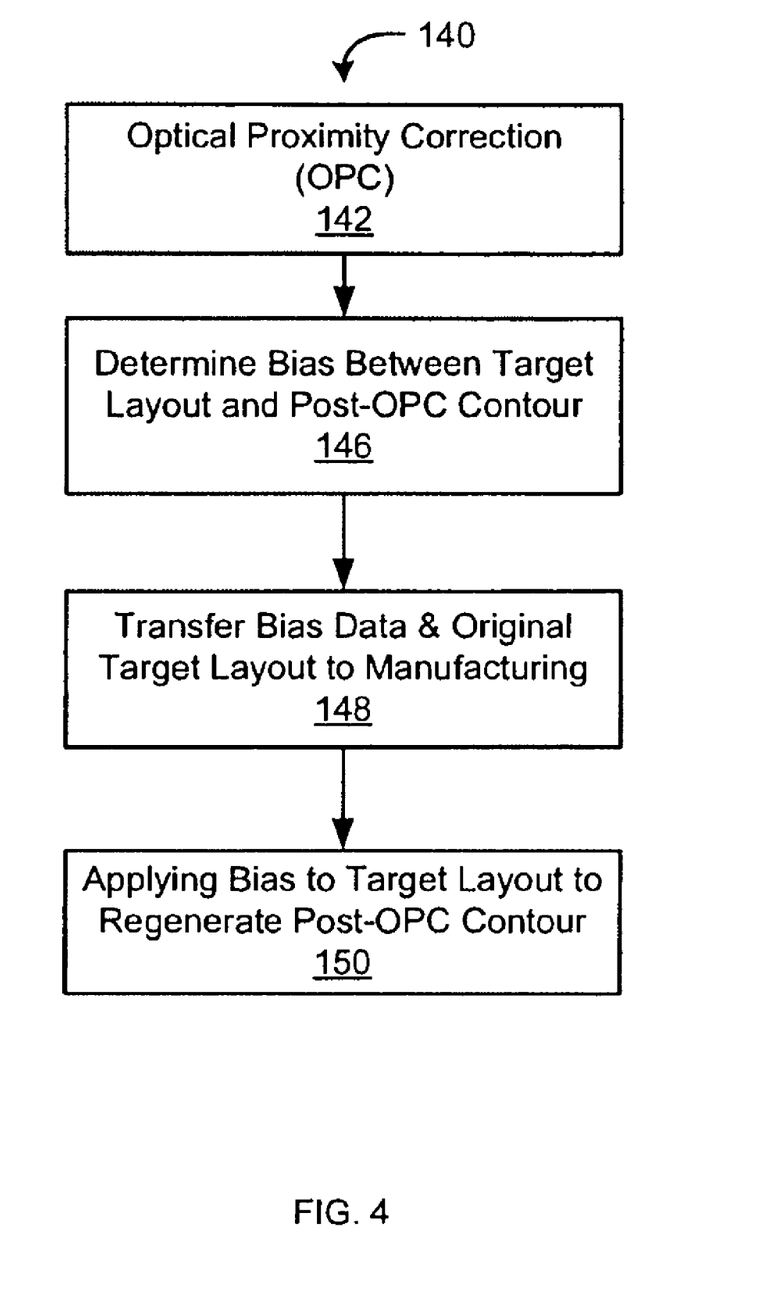
FIG. 4 is a diagram illustrating an example process for targeting optical proximity correction to the design-phase post-OPC contour in accordance with one embodiment of the invention.

FIG. 4 is a diagram illustrating an example process 140 for targeting optical proximity correction to the design-phase post-OPC contour in accordance with one embodiment of the invention. Referring now to FIG. 4, at operation 140, optical proximity correction is performed. This optical proximity correction is performed in the design phase before the design is finalized 14 for tape-out. As noted above, in one embodiment, optical proximity correction can result in the generation of post-OPC design-phase contour data and post-OPC design phase layout data. As also as described above, the optical proximity correction operation can be performed utilizing dissection points and evaluation points.

At operation 146, the differences, or bias, between original target layout in the post-OPC contour are determined. As noted above, in one embodiment, these differences can be determined with respect to dissection points and evaluation points, thus defining a scope for the data set. As an example, with reference to the example layout portions described in FIG. 3, bias data can represent differences between evaluation points 195 on the target layout 190 and respective points on post-OPC contour 184 within segments defined by dissection points 194.

At operation 148, the original target data and bias data are transferred to the manufacturing phase. As previously noted, because in some embodiments, the bias data can be significantly smaller than the data set representing contour 184, this data transfer can be more efficient. At the manufacturing phase, the transferred bias data can be applied to the original layout data to generate the post-OPC contour as determined in the design phase. Having generated this target contour data, optical proximity correction can be performed at the manufacturing phase to target this design-phase post-OPC contour data rather than targeting the original layout target. This is illustrated by operation 150. Using contour data as the target for OPC rather than the 'ideal' target layout can yield better results. This is because the post-OPC more closely represents the actual circuit layout expected to be realized than does the ideal target layout (which can be difficult if not impossible to achieve in practice).

Accordingly, once the post-OPC contour is regenerated from the original target data and bias data, the post-OPC contour is used as the target (reference) layout for several manufacturing phase operations. Examples of such operations include, but are not limited to, use as the target for optical proximity correction, use as the target for lithographic verification, use as the reference image for mask inspection, use as the reference image for wafer inspection, and use as the reference image for wafer metrology. When the post-OPC contour becomes the target or reference of processes within the manufacturing phase, the circuit that results on the wafer is closer to what was expected during the design phase (closer to the original target layout). This is because the post-OPC contour data generated during the design phase represents the achievable realization of the original target layout upon wafer, accounting for both limitations of optical proximity correction (OPC) tools and the existence of "hot spots." "Hot spots" are areas on the circuit layout lacking sufficient latitude for mistakes during wafer printing. Accordingly, hot spots are considered uncorrectable even by the best resolution enhancement techniques (RET).

Figure 5:
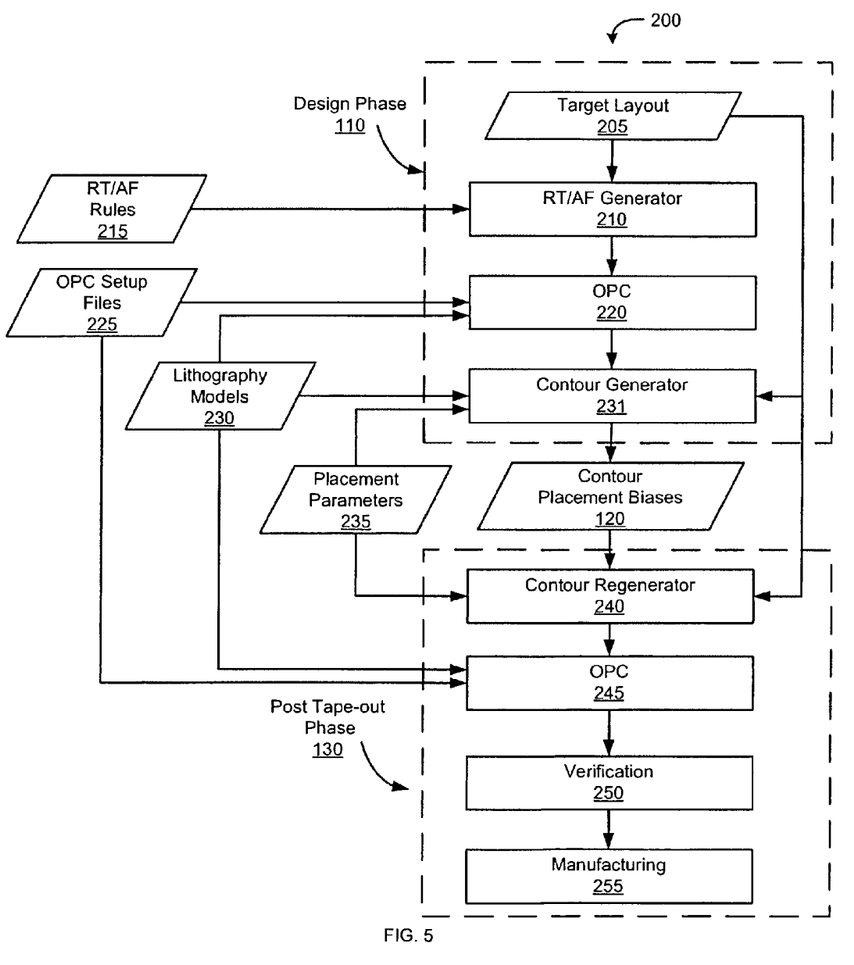
FIG. 5 is a flowchart illustrating an example design for manufacturability (DFM) implementation of the techniques described herein in accordance with one embodiment of the invention.

FIG. 5 is a flowchart 200 illustrating an example design for manufacturability (DFM) implementation of the techniques described herein in accordance with one embodiment of the invention. Referring now to FIG. 5, in the example process is described with respect to a design phase 110 and a post-tape-helped phase, or manufacturing phase, 130. In the design phase, target layout data 205 is generated based on the circuit design data. As described above, target layout data 205 represents, at least, an ideal layout independent of real-world process conditions.

Within the design phase 110, the target layout data 205 is processed through a re-targeting and assist feature generator 210. For example, this can be accomplished through re-targeting and assist feature rules 215, both of which are commonly known in the art. The output from the re-targeting and assist feature generator 210 is processed by an optical proximity correction (OPC) process 220. Typically, the OPC process 220 uses OPC setup files 225 and lithography models 230 to generate post-OPC layout data. An example of a portion of a layout feature after retargeting and assist and optical proximity correction are applied, is illustrated in FIG. 2 at 175. The post-OPC layout dataset is then processed by a contour generator 231 to create a contour dataset representing the post-OPC layout as applied to the device layer after the photolithographic operations. The contour data can be used during the design phase for lithography verification and electrical verification.

In an embodiment of this invention, bias data is used to represent the post-OPC contour. For example, the contour generator 231 can use placement parameters 235 and the original target layout 205 to calculate contour placement biases 120 between the target contour and the original target layout. As noted, is contour bias data 120 can be transferred to the manufacturing phase along with the original layout data to allow enhanced optical proximity correction to be performed in the manufacturing phase. Accordingly, the process continues by transferring contour placement biases 120 to the manufacturing phase (i.e. post tape-out phase 130) along with the original target layout data. Within the post tape-out phase 130, a contour regenerator 240 is used to recreate the contour layout. In some embodiments, the contour regenerator 240 uses the same placement parameters 235 as the ones used to generate the placement biases 120 in the design phase. In other embodiments, the contour regenerator 240 uses the target layout 205 in conjunction with the placement parameters 235 and the contour data in the form of placement biases 120 to recreate the contour layout. In the OPC process 245, this recreated contour layout can be used in place of the original target layout data to create a post-OPC layout in the manufacturing phase 130. The OPC process 245 can be similar to the OPC process 220 performed in the post tape-out phase 130 rather than the design phase 110. The process 245 continues to verification at 250, where the post-OPC design can be verified. Upon verification, manufacturing takes place at 255.

Embodiments described above reference the use of contour data in the manufacturing-phase OPC process 245 in place of target layout data. In other embodiments of the invention, the contour data can be used as the target for verification 250. In some embodiments, verification 250 can include lithography verification before the design is sent for manufacturing.

Figure 6:
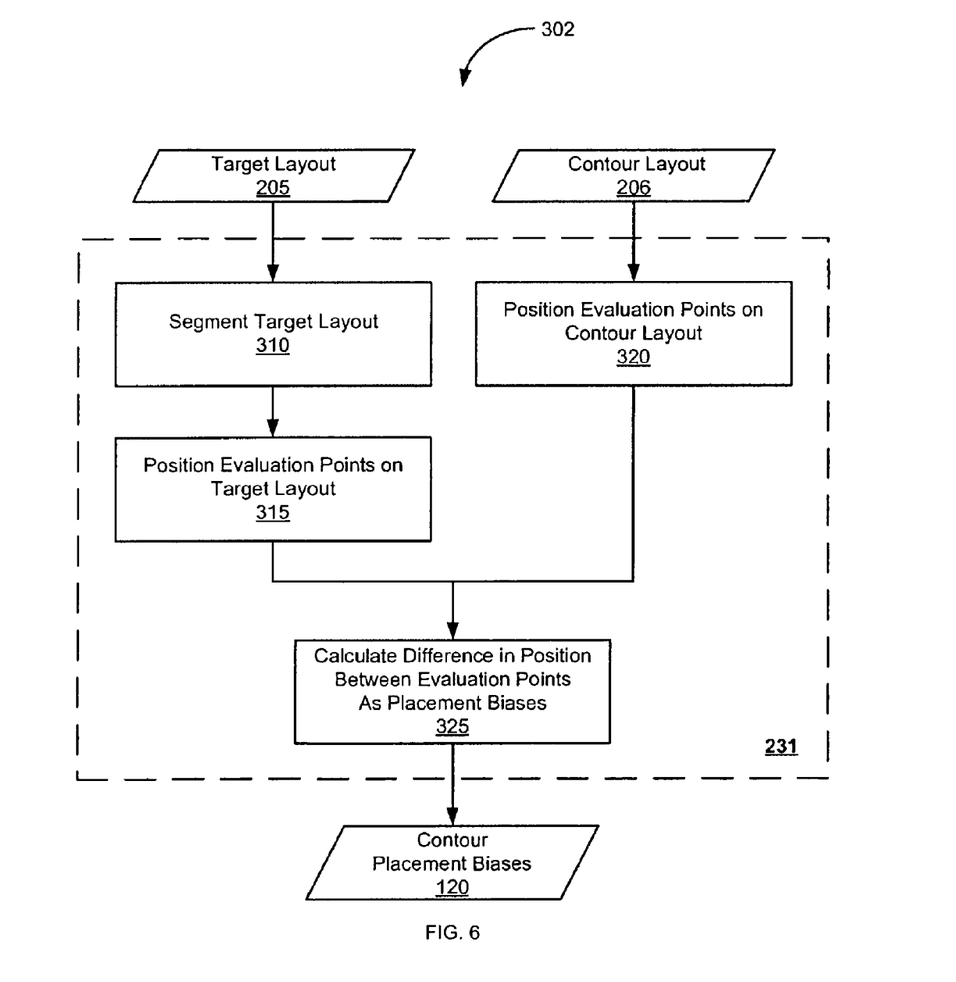
FIG. 6 is a flowchart illustrating an example process for calculating contour placement biases in accordance with one embodiment of the invention.

FIG. 6 is a flowchart illustrating an example process 302 for calculating contour placement biases in accordance with one embodiment of the invention. Referring now to FIG. 6, target circuit layout data set 205 and contour layout data set 206 are received by contour generation process 231. At operation 310, portions of the target layout are divided into a plurality of segments. For example, in one embodiment, that section points 194 can be utilized to define the segments into which the layout portions are divided. Dissection points and segment definitions can be chosen based on knowledge of typical or anticipated effects of the photolithographic process. For example, in one embodiment, dissection points can be placed within a predetermined distance of corners of the layout portion. As a further example, consider layout portion 193 illustrated in FIG. 3 where dissection points 194 are positioned along the line segments at each edge of portion 193 and proximate to the corners of the feature.

At operation 315, evaluation points are positioned in the target layout. Evaluation points can also be positioned based on knowledge of the optical proximity correction process. For example, one embodiment places evaluation points near corners in the identified segments as well as near the center of longer line segments. Again, layout portion 193 illustrated in FIG. 3 provides a further example where evaluation points 195 are placed proximate corners of layout portion 193 and in the center of straight line segments between two dissection points 194.

At operation 320, evaluation points are defined for contour layout data set 206. In one embodiment, the evaluation points for contour layout data set 206 are defined such that they are positioned in locations at least roughly equivalent to evaluation points generated at operation 315 for target layout data set 205.

At operation 325, differences between the contour layout data set and a target layout data set are computed. Particularly, differences in position between respective evaluation points for the contour data set and layout data set are computed. From this, contour placement biases 120 can be generated.

Figure 7:
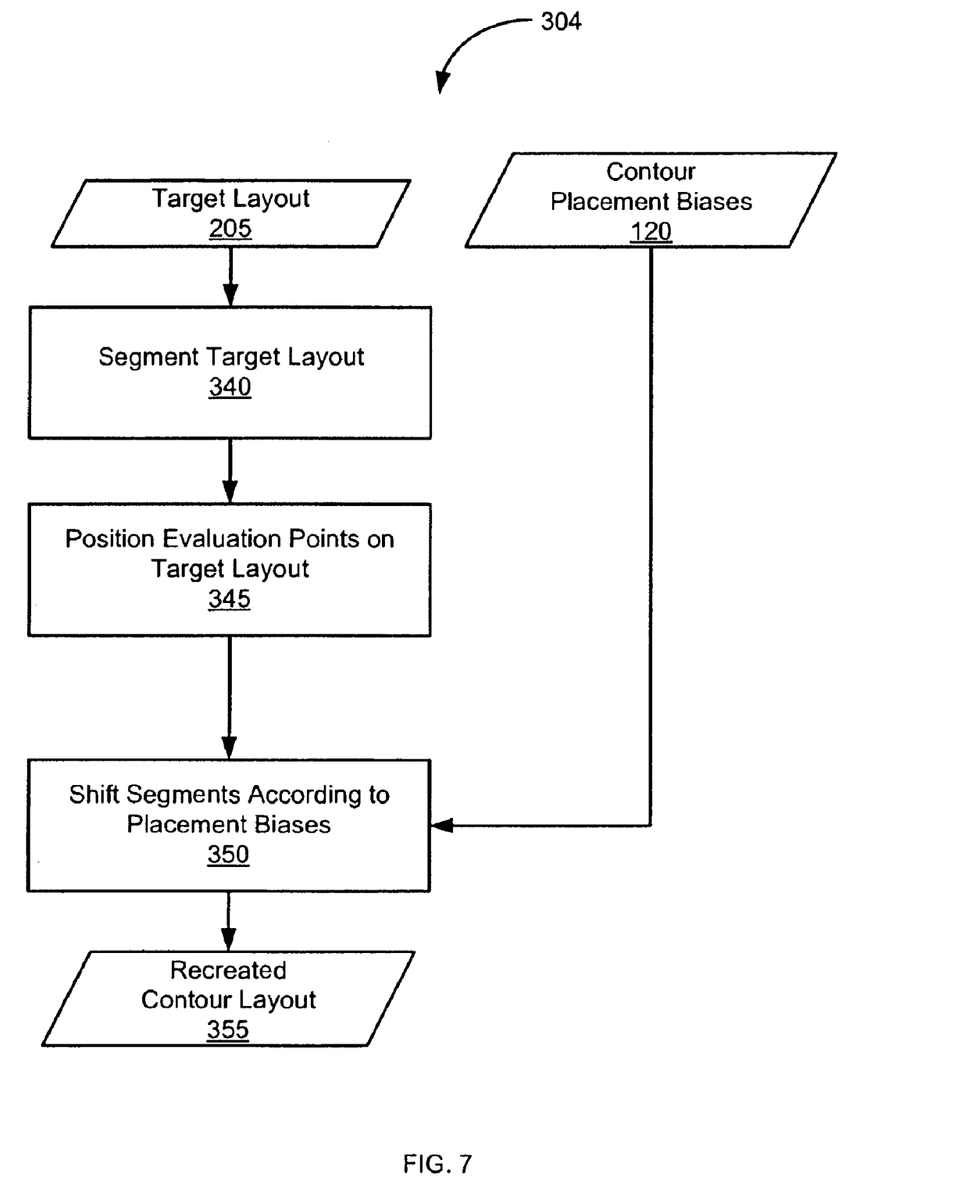
FIG. 7 is a flowchart illustrating an example process for generating the post-OPC contour in the manufacturing phase.

FIG. 7 is a flowchart illustrating an example process 304 for generating the post-OPC contour in the manufacturing phase. In some embodiments, a contour regenerator similar to that of 240 is used to perform process 700. Referring now to FIG. 7, target circuit layout data set 205 is received by process 240. Operations 340 and 345 are similar to operations 310 and 315 of FIG. 6. At operation 340, portions of the target layout are divided into a plurality of segments. For example, in one embodiment, that section points 194 can be utilized to define the segments into which the layout portions are divided. Dissection points and segment definitions can be chosen based on knowledge of typical effects of the photolithographic process. For example, in one embodiment, dissection points can be placed within a predetermined distance of corners of the layout portion. As a further example, consider layout portion 193 illustrated in FIG. 3 where dissection points 194 are positioned along the line segments at each edge of portion 193 and proximate to the corners of the feature.

At operation 345, evaluation points are positioned in the target layout. Evaluation points can also be positioned based on knowledge of the optical proximity correction process. For example, one embodiment places evaluation points near corners in the identified segments as well as near the center of longer line segments. Again, layout portion 193 illustrated in FIG. 3 provides a further example where evaluation points 195 are placed proximate corners of layout portion 193 and in the center of straight line segments between two dissection points 194.

At operation 350, method 304 receives contour placement biases 120 and utilizes it to shift segments of target layout according to the placement biases. The resulting layout should be at least roughly equivalent if not identical to the contour layout 205 originally generated during a design phase. Then, this generated contour layout 205 is employed within the manufacturing phase processes.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 8:
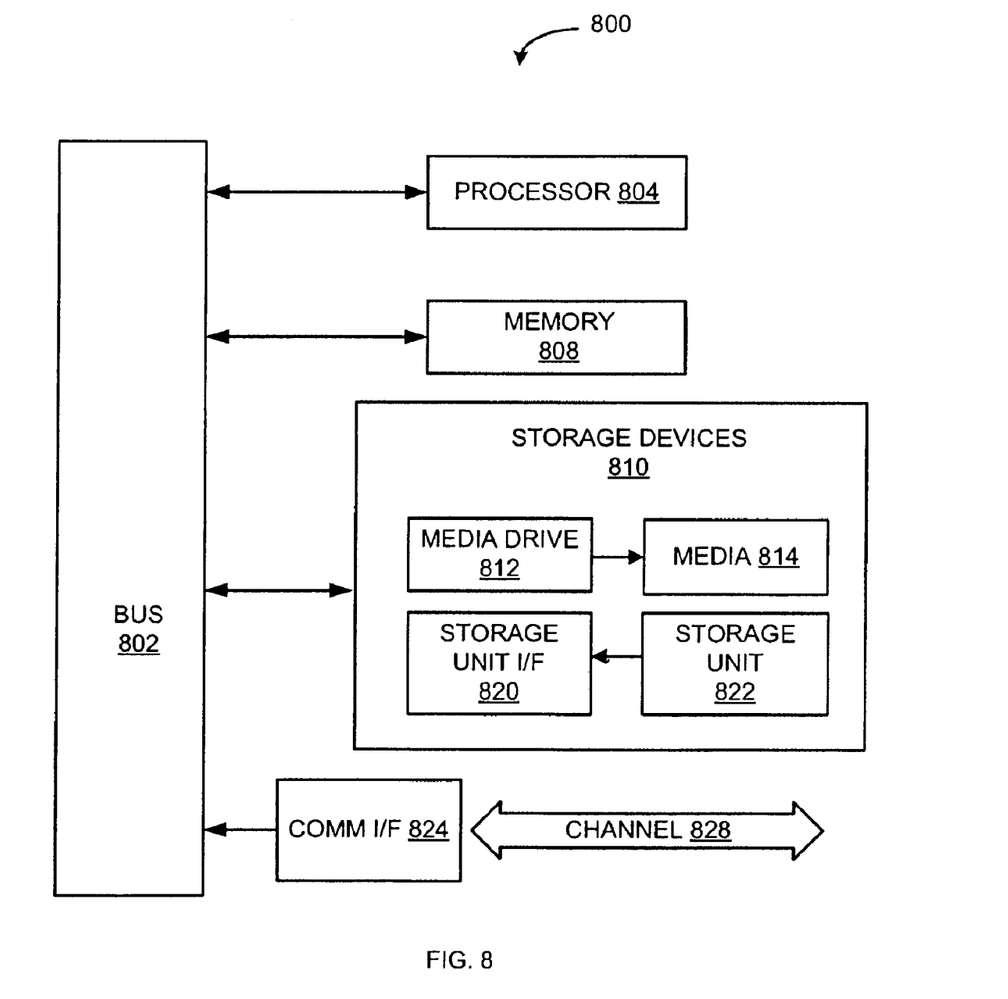
FIG. 8 is a diagram illustrating a computer system that can be used in conjunction with the systems and methods described herein.

Referring now to FIG. 8, computing module 800 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 800 might also represent computing capabilities embedded within or otherwise available to a given device. For example, a computing module might be found in other electronic devices. Computing module 800 might include, for example, one or more processors or processing devices, such as a processor 804. Processor 804 might be implemented using a general-purpose or special-purpose processing engine such as, for example, a microprocessor, controller, or other control logic.

Computing module 800 might also include one or more memory modules, referred to as main memory 808. For example, random access memory (RAM) or other dynamic memory might be used for storing information and instructions to be executed by processor 804. Main memory 808 might also be used for storing temporary variables or other intermediate information during execution of instructions by processor 804. Computing module 800 might likewise include a read only memory ("ROM") or other static storage device coupled to bus 802 for storing static information and instructions for processor 804.

The computing module 800 might also include one or more various forms of information storage mechanism 810, which might include, for example, a media drive 812 and a storage unit interface 820. The media drive 812 might include a drive or other mechanism to support fixed or removable storage media 814. For example, a hard disk drive, a floppy disk drive, a magnetic tape drive, an optical disk drive, a CD or DVD drive (R or RW), or other removable or fixed media drive. Accordingly, storage media 814 might include, for example, a hard disk, a floppy disk, magnetic tape, cartridge, optical disk, a CD or DVD, or other fixed or removable medium that is read by, written to or accessed by media drive 812. As these examples illustrate, the storage media 814 can include a computer usable storage medium having stored therein particular computer software or data.

In alternative embodiments, information storage mechanism 810 might include other similar instrumentalities for allowing computer programs or other instructions or data to be loaded into computing module 800. Such instrumentalities might include, for example, a fixed or removable storage unit 822 and an interface 820. Examples of such storage units 822 and interfaces 820 can include a program cartridge and cartridge interface, a removable memory (for example, a flash memory or other removable memory module) and memory slot, a PCMCIA slot and card, and other fixed or removable storage units 822 and interfaces 820 that allow software and data to be transferred from the storage unit 822 to computing module 800.

Computing module 800 might also include a communications interface 824. Communications interface 824 might be used to allow software and data to be transferred between computing module 800 and external devices. Examples of communications interface 824 might include a modem or softmodem, a network interface (such as an Ethernet, network interface card, WiMedia, 802.XX or other interface), a communications port (such as for example, a USB port, IR port, RS232 port, Bluetooth interface, or other port), or other communications interface. Software and data transferred via communications interface 824 might typically be carried on signals, which can be electronic, electromagnetic, optical or other signals capable of being exchanged by a given communications interface 824. These signals might be provided to communications interface 824 via a channel 828. This channel 828 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 808, storage unit 820, media 814, and signals on channel 828. These and other various forms of computer program media or computer usable media may be involved in carrying one or more sequences of one or more instructions to a processing device for execution. When executed, such instructions might enable the computing module 800 to perform features or functions of the present invention as discussed herein.

While various embodiments of the present invention have been described above, it should be understood that they have been presented by way of example only, and not of limitation. The breadth and scope of the present invention should not be limited by any of the above-described exemplary embodiments. Where this document refers to technologies that would be apparent or known to one of ordinary skill in the art, such technologies encompass those apparent or known to the skilled artisan now or at any time in the future. In addition, the invention is not restricted to the illustrated example architectures or configurations, but the desired features can be implemented using a variety of alternative architectures and configurations. As will become apparent to one of ordinary skill in the art after reading this document, the illustrated embodiments and their various alternatives can be implemented without confinement to the illustrated example. One of ordinary skill in the art would also understand how alternative functional, logical or physical partitioning and configurations could be utilized to implement the desired features of the present invention.

Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A computer-aided design system configured to generate photolithographic data for patterning a circuit design onto a semiconductor wafer, comprising:
    a design tool having a processor, a memory connected to the processor, and a non-transitory computer readable medium having instructions embedded therein, the instructions configured to cause the processor to perform the operations of:
        receiving target layout data for the circuit design;
        performing optical proximity correction on the target layout data to generate post-OPC layout data;
        generating contour layout data from post-OPC layout data; and
        calculating differences between the contour layout data and the target layout data to generate contour bias data; and
    a manufacturing tool having a processor, a memory connected to the processor, and a non-transitory computer readable medium having instructions embedded therein, the instructions configured to cause the processor to perform the operations of:
        receiving the target layout data for the circuit design and the contour bias data from the design tool;
        applying the contour bias data to the target layout data to regenerate contour layout data at the manufacturing tool; and
        performing optical proximity correction on the regenerated contour data to generate second post-OPC layout data.

2. The computer-aided design system to claim 1, wherein calculating differences comprises:

determining a plurality of evaluation points for the contour layout data, wherein the plurality of evaluation points corresponds to evaluation points used to perform optical proximity correction on the target layout; and calculating a displacement between respective ones of the evaluation points for the contour layout data and the evaluation points used to perform optical proximity correction.

3. A method of generating compressed photolithographic data for patterning a circuit design onto a semiconductor wafer, comprising the operations of:

using a computer system to perform optical proximity correction on target layout data for the circuit design to generate post-OPC layout data;

generating contour layout data from post-OPC layout data;

calculating differences between the contour layout data and the target layout data to generate contour bias data; and storing the contour bias data for use in recreating contour layout data.

4. The method of claim 3, further comprising the operation of transferring the target layout data for the circuit design and the contour bias data to a manufacturing tool, wherein the manufacturing tool is configured to apply the contour bias data to the target layout data to regenerate contour layout data and to perform optical proximity correction on the regenerated contour data to generate second post-OPC layout data.

5. The method of claim 3, further comprising the operations of:

receiving at a post-tape-out manufacturing phase tool the target layout data for the circuit design and the contour bias data for post-tape out optical proximity correction;

applying the contour bias data to the target layout data to regenerate contour layout data during post-tape out optical proximity correction; and performing post-tape out optical proximity correction on the regenerated contour data to generate second post-OPC layout data.

6. The method of claim 5, wherein as a result of regenerating contour data, post-tape out optical proximity correction is performed without transferring post-OPC layout data from a design tool to the post-tape-out manufacturing phase tool.

7. A method of generating post-tape-out photolithographic data for patterning a circuit design onto a semiconductor wafer, comprising the operations of:

receiving at a post-tape-out manufacturing phase, target layout data and contour bias data for the circuit design, wherein contour bias data comprises data representing differences between a contour layout represented by the contour layout data generating during optical proximity correction and a target layout represented by the target layout data; and using a computer system to apply the contour bias data to the target layout data to regenerate contour layout data and to perform optical proximity correction on the regenerated contour data to generate manufacturing layout data.

8. The method of claim 7, further comprising the operation of generating the contour bias data, and wherein the operation of generating the contour bias data comprises:

determining a plurality of evaluation points for the contour layout data, wherein the plurality of evaluation points corresponds to evaluation points used to perform optical proximity correction on the target layout; and calculating a displacement between respective ones of the evaluation points for the contour layout data and the evaluation points used to perform optical proximity correction.

9. The method of claim 7, wherein as a result of regenerating contour data, post-tape out optical proximity correction is performed without transferring post-OPC layout data from a design tool to the post-tape-out manufacturing phase tool.

10. A computer-aided design apparatus configured to generate photolithographic data for patterning a circuit design onto a semiconductor wafer, comprising:

a processor;

a memory connected to the processor; and a computer readable medium having instructions embedded therein, the instructions configured to cause the processor to perform the operations of:

performing optical proximity correction on target layout data for the circuit design to generate post-OPC layout data;

generating contour layout data from post-OPC layout data;

calculating differences between the contour layout data and the target layout data to generate contour bias data; and storing the contour bias data for use in recreating contour layout data.

11. The computer-aided design apparatus of claim 10, wherein the instructions are further configured to cause the processor to perform the operation of transferring the target layout data for the circuit design and the contour bias data to a manufacturing tool, and wherein the manufacturing tool is configured to apply the contour bias data to the target layout data to regenerate contour layout data and to perform optical proximity correction on the regenerated contour data to generate second post-OPC layout data.

12. The computer-aided design apparatus of claim 10, further comprising a second computer readable medium having instructions embedded therein, the instructions configured to cause a processor to perform the operations of:

receiving at a post-tape-out manufacturing phase tool the target layout data for the circuit design and the contour bias data for post-tape out optical proximity correction;

applying the contour bias data to the target layout data to regenerate contour layout data during post-tape out optical proximity correction; and performing post-tape out optical proximity correction on the regenerated contour data to generate second post-OPC layout data.

13. A computer-aided design apparatus configured to generate photolithographic data for patterning a circuit design onto a semiconductor wafer, comprising:

a processor;

a memory connected to the processor; and a computer readable medium having instructions embedded therein, the instructions configured to cause the processor to perform the operations of:

receiving at a post-tape-out manufacturing phase, target layout data and contour bias data for the circuit design, wherein contour bias data comprises data representing differences between a contour layout represented by the contour layout data generated during optical proximity correction and a target layout represented by the target layout data;

applying the contour bias data to the target layout data to regenerate contour layout data and to perform post-tape out optical proximity correction on the regenerated contour data to generate manufacturing layout data.

14. The computer-aided design apparatus of claim 13, wherein the instructions are further configured to cause the processor to perform the operation of generating the contour bias data, and wherein generating the contour bias data comprises:
  determining a plurality of evaluation points for the contour layout data, wherein the plurality of evaluation points corresponds to evaluation points used to perform optical proximity correction on the target layout; and
  calculating a displacement between respective ones of the evaluation points for the contour layout data and the evaluation points used to perform optical proximity correction.

15. The computer-aided design apparatus of claim 13, wherein as a result of regenerating contour data, post-tape out optical proximity correction is performed without transferring post-OPC layout data from a design tool to the post-tape-out manufacturing phase.

16. A computer program product having instructions embedded in a non-transitory computer useable medium, the instructions configured to cause a processor to perform the operations of:
  performing optical proximity correction on target layout data for a circuit design to generate post-OPC layout data;
  generating contour layout data from post-OPC layout data; and
  calculating differences between the contour layout data and the target layout data to generate contour bias data; and
  storing the contour bias data for use in recreating contour layout data.

17. The computer program product of claim 16, the instructions are further configured to cause a processor to perform the operation of transferring the target layout data for the circuit design and the contour bias data to a manufacturing tool, wherein the manufacturing tool is configured to apply the contour bias data to the target layout data to regenerate contour layout data and to perform optical proximity correction on the regenerated contour data to generate second post-OPC layout data.

18. The computer program product of claim 16, the instructions are further configured to cause a processor to perform the operations of:
  receiving at a post-tape-out manufacturing phase tool the target layout data for the circuit design and the contour bias data for post-tape out optical proximity correction;
  applying the contour bias data to the target layout data to regenerate contour layout data during post-tape out optical proximity correction; and
  performing post-tape out optical proximity correction on the regenerated contour data to generate second post-OPC layout data.

19. The computer program product of claim 18, wherein as a result of regenerating contour data, post-tape out optical proximity correction is performed without transferring post-OPC layout data from a design tool to the post-tape-out manufacturing phase tool.

20. The computer program product of claim 18, wherein as a result of regenerating contour data, post-tape out optical proximity correction is performed without transferring post-OPC layout data from a design tool to the post-tape-out manufacturing phase tool.

21. A computer program product having instructions embedded in a non-transitory computer useable medium, the instructions configured to cause a processor to perform the operations of:
  receiving at a post-tape-out manufacturing phase, target layout data and contour bias data for the circuit design, wherein contour bias data comprises data representing differences between a contour layout represented by the contour layout data generating during optical proximity correction and a target layout represented by the target layout data; and
  applying the contour bias data to the target layout data to regenerate contour layout data and to perform optical proximity correction on the regenerated contour data to generate manufacturing layout data.

22. The computer program product of claim 21, wherein the instructions are further configured to cause a processor to perform the operations of generating the contour bias data, and wherein the operation of generating the contour bias data comprises:
  determining a plurality of evaluation points for the contour layout data, wherein the plurality of evaluation points corresponds to evaluation points used to perform optical proximity correction on the target layout; and
  calculating a displacement between respective ones of the evaluation points for the contour layout data and the evaluation points used to perform optical proximity correction.

* * * * *